US008847389B1

(12) United States Patent  
Chang et al.

(10) Patent No.: US 8,847,389 B1  
(45) Date of Patent: Sep. 30, 2014

(54) METHOD AND APPARATUS FOR A CONDUCTIVE BUMP STRUCTURE

(71) Applicant: Taiwan Semiconductor Manufacturing Company, Ltd., Hsin-Chu (TW)

(72) Inventors: Jung-Hua Chang, Hsin-Chu (TW); Cheng-Lin Huang, Hsin-Chu (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/889,053

(22) Filed: May 7, 2013

Related U.S. Application Data

(60) Provisional application No. 61/777,025, filed on Mar. 12, 2013.

(51) Int. Cl.  
*H01L 23/498* (2006.01)  
*H01L 23/00* (2006.01)

(52) U.S. Cl.  
CPC .......... *H01L 23/49816* (2013.01); *H01L 24/81* (2013.01)  
USPC ......................................................... 257/737

(58) Field of Classification Search  
USPC ................... 257/737, 774, E23.011  
See application file for complete search history.

(56) References Cited

U.S. PATENT DOCUMENTS

| 6,515,361 | B2 * | 2/2003 | Lee et al. ........... 257/738 |
| 7,253,520 | B2 * | 8/2007 | Yoshida et al. ........... 257/738 |
| 7,834,462 | B2 * | 11/2010 | Dobritz et al. ........... 257/774 |
| 2012/0056315 | A1 * | 3/2012 | Chang et al. ........... 257/737 |
| 2013/0285257 | A1 * | 10/2013 | Lee et al. ........... 257/774 |

\* cited by examiner

*Primary Examiner* — Thao P Le  
(74) *Attorney, Agent, or Firm* — Slater and Matsil, L.L.P.

(57) ABSTRACT

A method and apparatus for a conductive bump structure is provided. The conductive bump structure may include a conductive layer and a conductive bump formed over a through via ("TV"). The TV may be formed through a substrate and a passivation layer. The TV may have a top surface extending above a top surface of the passivation layer. The conductive layer may be formed directly over the TV using one or more electroless plating processes. The conductive layer may have sides that may taper from a top surface of the conductive layer to the top surface of the passivation layer. The conductive layer may include a plurality of layers, wherein each layer may be formed using one or more electroless plating processes. The conductive bump may be formed on the conductive layer and may be reflowed to couple the conductive bump to the conductive layer.

20 Claims, 10 Drawing Sheets

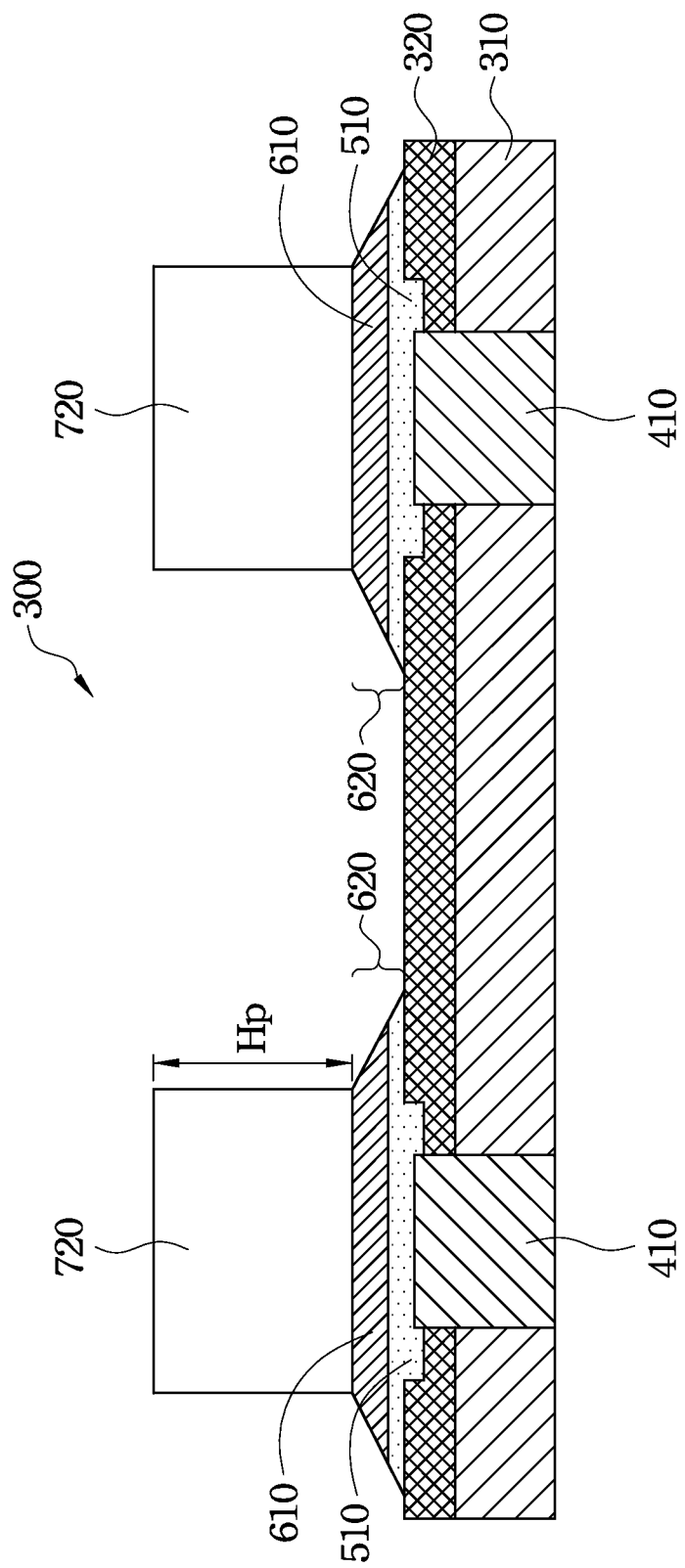

METHOD AND APPARATUS FOR A CONDUCTIVE BUMP STRUCTURE

CROSS REFERENCE TO RELATED APPLICATIONS

The present application claims priority to U.S. Provisional Patent Application Ser. No. 61/777,025 filed on Mar. 12, 2013, which application is hereby incorporated by reference herein. The present application is related to co-pending U.S. patent application Ser. No. 13/795,081, entitled "Method and Apparatus for a Conductive Pillar Structure," filed on Mar. 12, 2013, commonly assigned to the assignee of the present application, which application is hereby incorporated by reference herein.

BACKGROUND

In a semiconductor manufacturing process, multiple semiconductor dies may be manufactured concurrently with each other by forming dies at the same time on a semiconductor wafer. The semiconductor dies may contain multiple devices such as transistors, resistors, capacitors, inductors, and the like, using, e.g., a combination of implantation, deposition, masking, etching, annealing, and passivating steps during the manufacturing process. Once formed, these devices may be connected to each other to form functional units and/or circuits using alternating layers of metallization and dielectric layers.

Contacts may be formed on the metallization and dielectric layers in order to provide external connection to the devices within the semiconductor dies. The individual semiconductor dies may be singulated from the wafer. The semiconductor dies may be integrated as part of a larger system or integrated circuit such as a three-dimensional integrated circuit ("3DIC"), which may be formed by stacking and interconnecting dies on top of each other. The contacts may be bumps such as micro-bumps or controlled collapse chip connection ("C4") bumps.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments. Throughout the various views and illustrative embodiments, like reference numbers are used to designate like elements.

Figure 1:
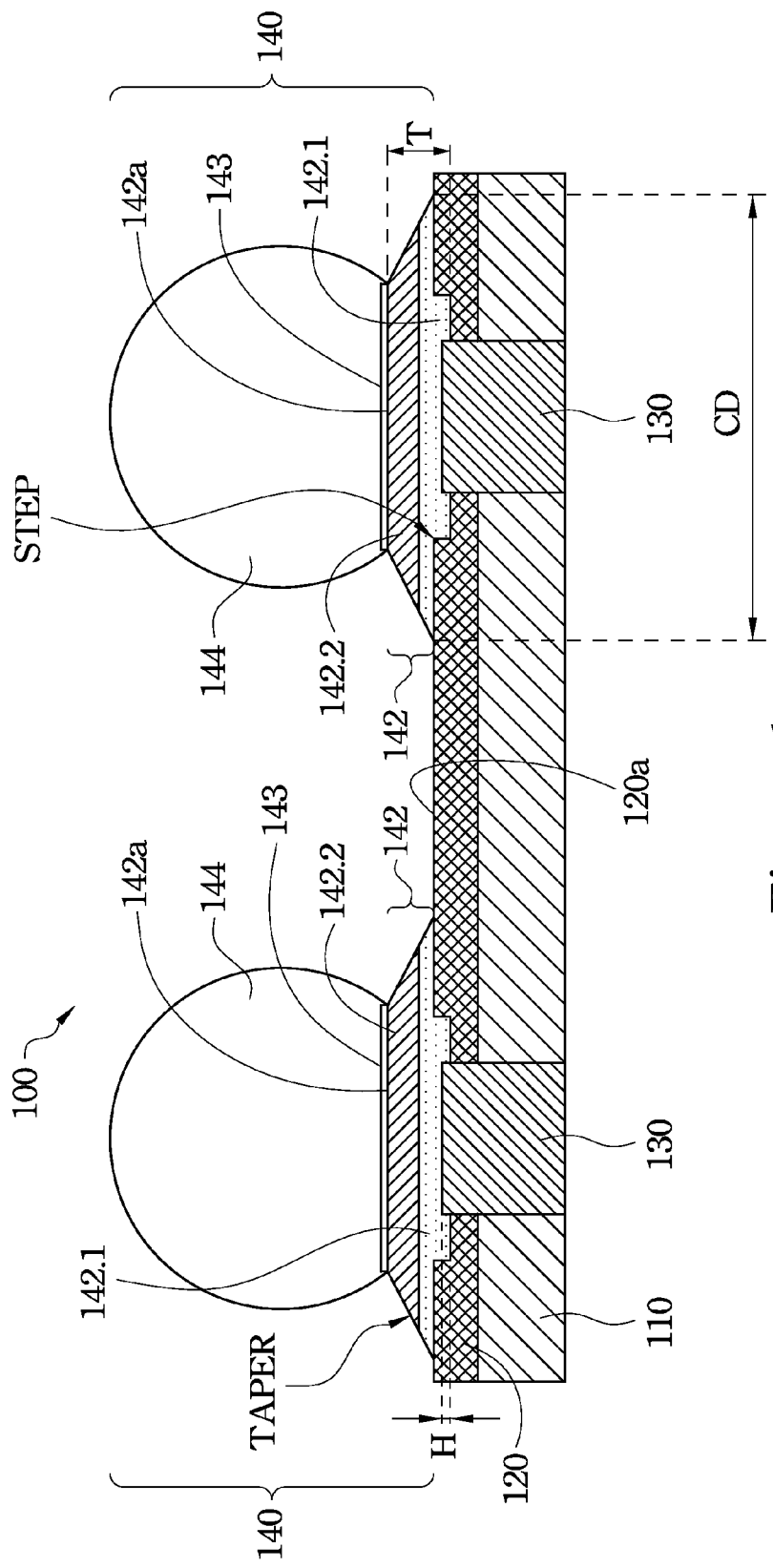
FIG. 1 illustrates a cross-sectional view of a device according to an embodiment.

FIG. 1 illustrates a cross-sectional view of a device 100 according to an embodiment. As illustrated in FIG. 1, the device 100 may include a substrate 110, a passivation layer 120, one or more conductive through vias ("TVs") 130 and one or more conductive structures 140. A pair of conductive structures 140 is illustrated in FIG. 1 for illustrative purposes only and is not meant to limit the scope of the present embodiments. Each conductive structure 140 may include a conductive layer 142 and a conductive bump 144.

The TV 130 may extend through both the substrate 110 and the passivation layer 120. As shown in FIG. 1, the TV 130 may be formed to extend or protrude past a top surface 120a of the passivation layer 120 to a height H. In various embodiments, the height H may range from approximately 0.05 μm to 0.5 μm.

The conductive layer 142 may be formed directly over the TV 130 and/or the passivation layer 120 using one or more electroless plating processes. The conductive layer 142 may have a non-planar surface, which is described in more detail in FIG. 9, below. In an embodiment, the conductive layer 142 may include a first layer 142.1 and a second layer 142.2. Each of the first and the second layers 142.1, 142.1 may be formed using one or more electroless plating process. In various embodiments, the first layer 142.1 may be made of copper, aluminum, titanium, tin palladium, platinum, combinations thereof or the like. In various embodiments, the second layer 142.2 may be formed of nickel, titanium, tin aluminum, palladium, platinum combinations thereof or the like.

In various embodiments, the conductive bump 144 may comprise a solder bump or paste that may be mounted or printed onto a top surface 142a of the conductive layer 142. The solder bump or solder paste may be reflowed to form the conductive bump 144 for the conductive structure 140. In an embodiment, the reflowing may form an inter-metallic compound ("IMC") layer 143 between the conductive bump 144 and the conductive layer 142, which may also have a non-planar surface. The conductive structures 140 may be referred to as micro-bump or C4 structures herein.

Forming the conductive layer(s) 142 using one or more electroless plating processes may decrease the overall manufacturing cost and/or lead time for forming the conductive structure(s) 140 as compared to previous techniques for forming micro-bump or C4 structures. For example, previous techniques for forming micro-bump or C4 structures utilized a multi-step process that included depositing or sputtering an intermediate under-bump metallization ("UBM") or seed layer over a TV and passivation layer; forming and patterning a photoresist layer over the UBM or seed layer; sputtering or depositing conductive materials over the UBM layer; removing the photoresist layer; and then finally etching and removing of portions of the UBM layer that were not covered by the conductive materials.

In contrast, the conductive layer(s) 142 of the embodiments of the present disclosure, which may be formed using one or more electroless plating processes, may alleviate the need for the forming, patterning and etching of an intermediate UBM layer during the formation of the conductive structure(s) 140. Further, using the first electroless plating processes, the first layer 142.1 may be aligned with and formed directly over the TV 130 without the need for a patterned photoresist layer to provide such alignment. For example, using a first electroless plating process, the first layer 142.1 may be formed directly over the TV 130 without an intermediate UBM layer between the first layer 142.1 and the TV 130 and without a patterned photoresist mask to align the first layer 142.1 to the TV 130. The second layer 142.2 may be formed directly on the first layer 142.1 using a second electroless plating process. The second layer 142.2 may provide for good adhesion between the first layer 142.1 and the conductive bump 144. The second layer 142.2 may be configured provide a barrier to prevent the interdiffusion of materials for the first layer 142.1 and the conductive bump 144. For illustrative purposes, two layers are shown for the conductive layer 142. However, in various embodiments, the conductive layer 142 may have more or fewer layers.

Electroless plating is an auto-catalytic chemical processing technique used to form or deposit a first metal-based material over a surface of a body or device, wherein the surface or portions of the surface comprise a second metal-based material. Electroless plating typically involves exposing and/or immersing the second metal-based surface portions of the body or device to a chemical solution comprising the first metal-based material. The chemical solution may also comprise a reducing agent that may react with metal ions of the first and second metal-based materials in order to deposit the first metal-based material over the exposed portions of the second metal-based material. The first metal-based material may be deposited or formed in a conformal manner over the exposed portions of the second metal-based material of the body or device. Embodiments of the present disclosure may also utilize combination electroless plating processes such as, for example, electroless plating such as electroless nickel, electroless palladium, immersion gold ("ENEPIG"), or electroless nickel immersion gold ("ENIG").

Thus, using one or more electroless plating processes, the conductive layer(s) 142 may be formed directly over the TV(s) 130 without the need of an intermediate UBM layer. The conductive layer(s) 142 may promote adhesion between the conductive structure(s) 140 and the TV(s) 130. Further, using one or more electroless plating processes, the conductive layer(s) 142 may be self-aligned to the TV(s) 130 without the need for an aligning photoresist layer. Accordingly, forming the conductive layer(s) 142 using one or more electroless plating processes, as described for the present embodiments, may decrease the number of processing steps and/or materials that may be used in forming the conductive layer(s) 142, which, in turn, may decrease the overall manufacturing cost and/or lead time for forming the conductive structure(s) 140 as compared to previous techniques.

As illustrated in FIG. 1, the conductive layer 142 may have a critical dimension ("CD") and a thickness, T. In various embodiments, the thickness T may range from approximately 3 μm to approximately 20 μm. In various embodiments, the critical dimension CD may range from approximately 20 μm to approximately 200 μm. In various embodiments, the conductive layer 142 may be formed using one or more electroless plating processes to have a CD to the thickness ratio, "CD/T ratio," that may be greater than or equal to approximately 1 and less than approximately 20, depending on processing variations for the electroless plating processes. For example, solution composition for an electroless plating process may be varied to change the material composition and the CD/T ratio for the conductive layer 142. A CD/T ratio that may be greater than or equal to approximately 1 and less than approximately 20, which may promote adhesion between the conductive bump 144 and the conductive layer 142.

As shown in FIG. 1, the conductive layer 142 may be formed having sides that taper from the top surface 142a of the conductive layer 142 down to the top surface 120a of the passivation layer 120. The taper of the conductive layer 142 may gradually narrow until the conductive layer 142 meets the top surface 120a of the passivation layer 120. The tapering may result from the one or more electroless plating processes used to form the conductive layer 142. In an embodiment wherein the conductive layer 142 may include the first layer 142.1 and the second layer 142.2, each of the first and second layers 142.1, 142.2 may also be formed having sides that taper in a similar manner as a result of the one or more electroless plating processes used to form the first and second layers 142.1, 142.2. The taper of the conductive layer 142 may vary based on processing variations for the electroless plating processes such as material composition for the electroless plating solution and/or processing time.

In various embodiments, the substrate 110 may be a substrate, a silicon substrate, an organic substrate, a ceramic substrate, a laminate substrate, an interposer, a packaged die or the like. In various embodiments, the passivation layer 120 may be formed of, for example, a polyimide layer, polybenzoxazole ("PBO"), benzocyclobutene ("BCB"), a non-photosensitive polymer, and in alternative embodiments, may be formed of nitride, carbide, silicon oxide, silicon nitride, low-k dielectrics such as carbon doped oxides, extremely low-k dielectrics such as porous carbon doped silicon dioxide combinations thereof, and/or other like material. In various embodiments, the passivation layer 120 may be formed to a thickness ranging from approximately 0.5 μm to approximately 2.5 μm.

FIG. 1 illustrates that the passivation layer 120 may have optional steps formed around the TVs 130, which may promote formation of the conductive layer 142 having a CD/T ratio that may be greater than or equal to approximately 1 and less than approximately 20. In an embodiment, the steps may be formed by forming and patterning another passivation layer (not shown) over the passivation layer 120. In various embodiments, the TV(s) 130 may be formed of copper, aluminum, gold, tungsten alloys thereof or the like. In various embodiments, the conductive bump 144 may comprise lead free solder, eutectic lead or the like.

Figure 9:
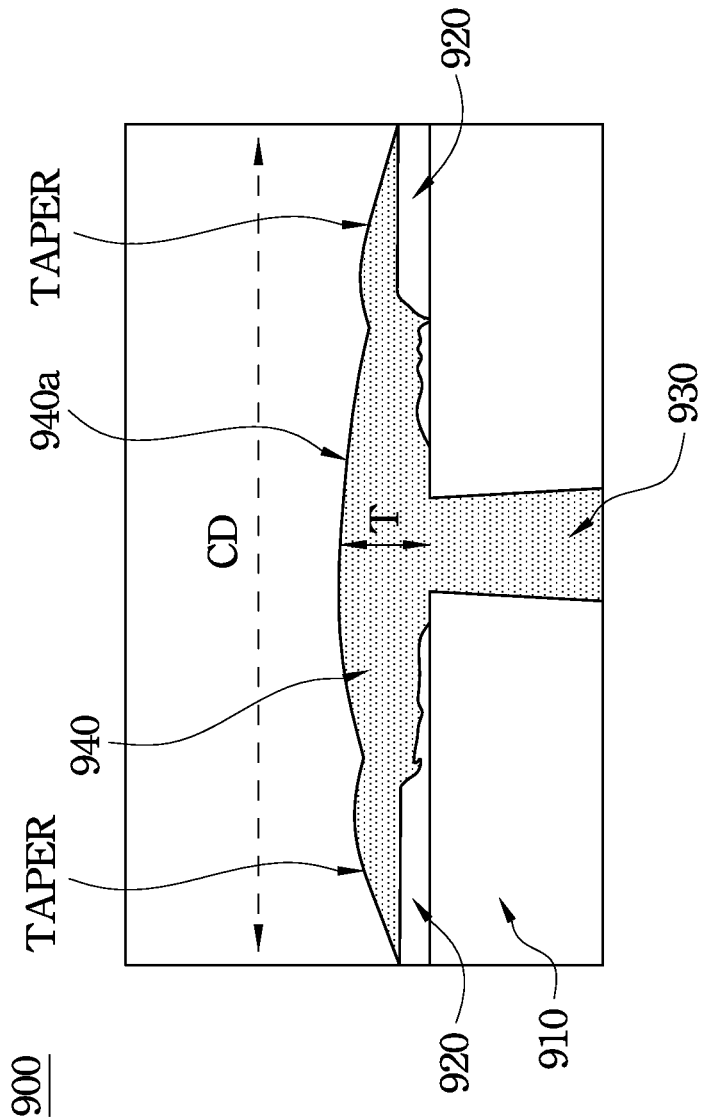
FIG. 9 illustrates a cross-sectional X-ray secondary-emission microscopy image of a conductive layer formed according to an embodiment.

It should be noted that the taper of the sides of the conductive layer 142 shown in FIG. 1 are provided for illustrative purposes only and are not meant to limit the scope of the embodiments discussed herein. FIG. 9, discussed in more detail below, provides an X-ray secondary-emission microscopy ("XSEM") image of an illustrative example of a conductive layer having tapered sides formed directly over a TV and a passivation layer.

Figure 2:
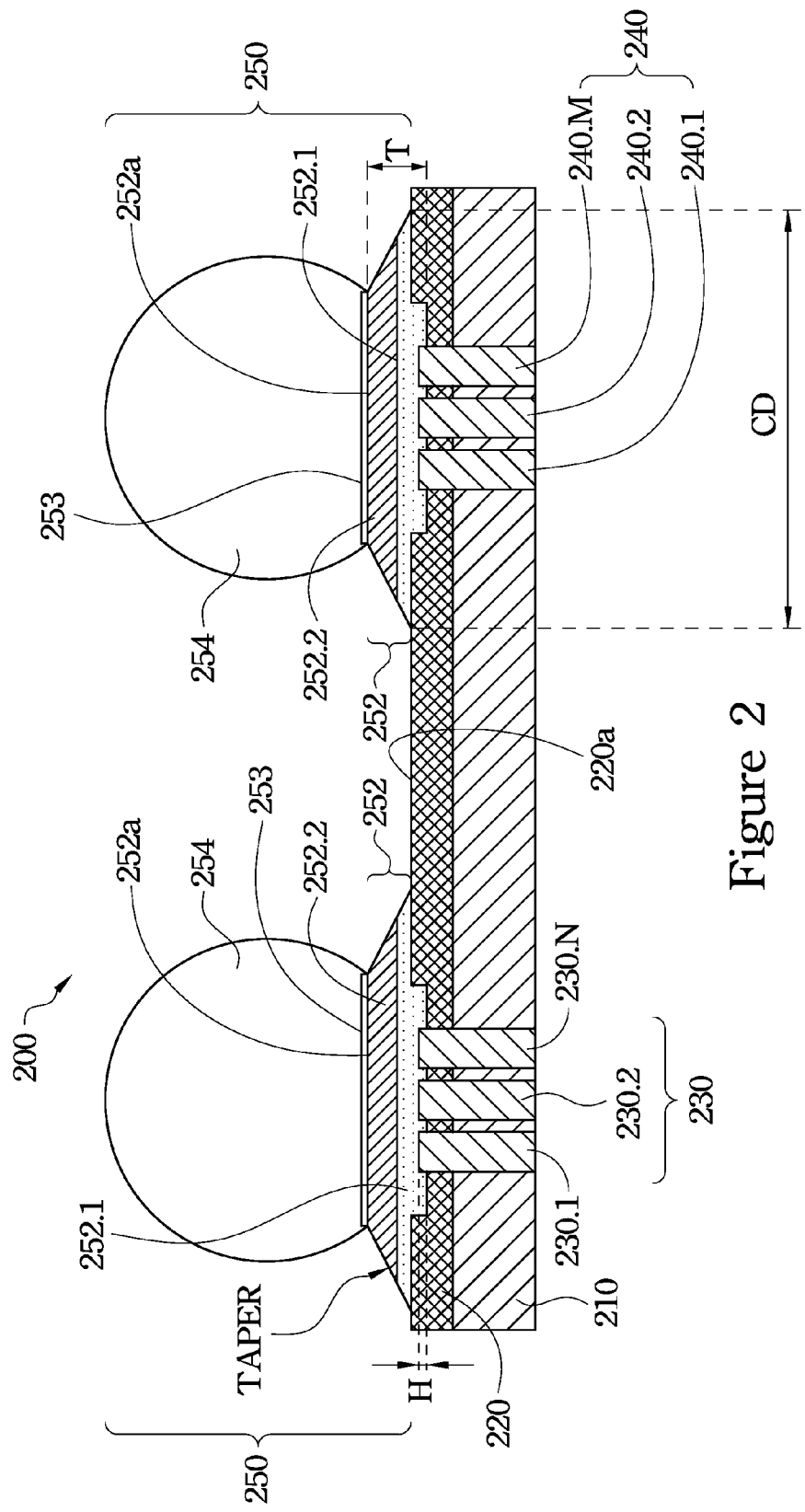
FIG. 2 illustrates a cross-sectional view of another device according to another embodiment.

FIG. 2 illustrates a device 200 formed according to another embodiment. The device 200 may include a substrate 210, a passivation layer 220, a first plurality of conductive TVs 230.1-230.N, a second plurality of conductive TVs 240.1-240.M, and one or more conductive structures 250. A pair of conductive structures 250 is illustrated in FIG. 2 for illustrative purposes only and is not meant to limit the scope of the embodiments of the present disclosure. Each conductive structure 250 may include a conductive layer 252 and a conductive bump 254.

The first plurality of TVs 230.1-230.N may collectively be referred to as a first TV 230. The second plurality of TVs 240.1-240.M may collectively be referred to as a second TV 240. In various embodiments, the number N of the first plurality of TVs 230.1-230.N may be equal to or different from the number M of the second plurality of TVs 240.1-240.M. As compared to FIG. 1, FIG. 2 illustrates that a conductive structure may be formed directly over a plurality of TVs, wherein the plurality of TVs may collectively form a TV that may extend through a device. The first plurality of TVs 230.1-230.N for the first TV 230 and the second plurality of TVs 240.1-240.M for the second TV 240, respectively, may provide a redundancy for the first and second TVs 230, 240 for extending through the substrate 210 and the passivation layer 220. As shown in FIG. 2, the first and second TVs 230, 240 may be formed to extend or protrude past a top surface 220a of the passivation layer 220 to a height H. In various embodiments, the height H may range from approximately 0.05 µm to 0.5 µm.

The conductive layer(s) 252 may be formed directly over the first and second TVs 230, 240 and the passivation layer 220 using one or more electroless plating processes. In an embodiment, the conductive layer 252 may include a first layer 252.1 and a second layer 252.2. Each of the first and the second layers 252.1, 252.1 may be formed using one or more electroless plating process. For illustrative purposes, two layers are shown for the conductive layer 252. However, in various embodiments, the conductive layer 252 may have more or fewer layers. In various embodiments, the conductive bump 254 may comprise a solder bump or paste that may be mounted or printed onto a top surface 252a the conductive layer 252. The solder bump or solder paste may be reflowed to form the conductive bump 254 for the conductive structure 250. In an embodiment, the reflowing may form an intermetallic compound ("IMC") layer 253 between the conductive bump 254 and the conductive layer 252, which may also have a non-planar surface.

Using one or more electroless plating processes, the conductive layer(s) 252 may be formed directly over the first and second TVs 230, 240 without the need of an intermediate UBM layer. The conductive layer(s) 252 may promote adhesion between the conductive structure(s) 250 and the first and second TVs 230, 240. Further, using one or more electroless plating processes, the conductive layer(s) 252 may be self-aligned to the first and second TVs 230, 240 without the need for an aligning photoresist layer.

As illustrated in FIG. 2, the conductive layer 252 may have a critical dimension ("CD") and a thickness, T. In various embodiments, the conductive layer 252 may be formed using one or more electroless plating processes to have a CD/T ratio that may be greater than or equal to approximately 1 and less than approximately 20, depending on processing variations for the electroless plating processes. For example, solution composition for an electroless plating process may be varied to change the material composition and the CD/T ratio for the conductive layer 252. A CD/T ratio that may be greater than or equal to approximately 1 and less than approximately 20, which may promote adhesion between the conductive bumps 254 and the corresponding conductive layers 252.

FIG. 2 illustrates that the passivation layer 220 may have optional steps formed around the first and second TVs 230, 240 which may promote formation of the conductive layer 252 having a CD/T ratio that may be greater than or equal to approximately 1 and less than approximately 20. In an embodiment, the steps may be formed by forming and patterning another passivation layer (not shown) over the passivation layer 220.

As shown in FIG. 2, the conductive layer 252 may be formed having sides that taper from the top surface 252a of the conductive layer 252 down to the top surface 220a of the passivation layer 220. The taper of the conductive layer 252 may gradually narrow until the conductive layer 252 meets the top surface 220a of the passivation layer 220. The tapering may result from the one or more electroless plating processes used to form the conductive layer 252. In an embodiment wherein the conductive layer 252 may include the first layer 252.1 and the second layer 252.2, each of the first and second layers 252.1, 252.2 may also be formed having sides that taper in a similar manner as a result of the one or more electroless plating processes used to form the first and second layers 252.1, 252.2. The taper of the conductive layer 252 may vary based on processing variations for the electroless plating processes, such as material composition for the electroless plating solution and/or processing time.

It should be noted that the taper of the sides of the conductive layer 252 shown in FIG. 2 are provided for illustrative purposes only and are not meant to limit the scope of the embodiments discussed herein. FIG. 9, discussed in more detail below, provides an XSEM image of an illustrative example of a conductive layer having tapered sides formed directly over a TV and a passivation layer.

Figure 3:
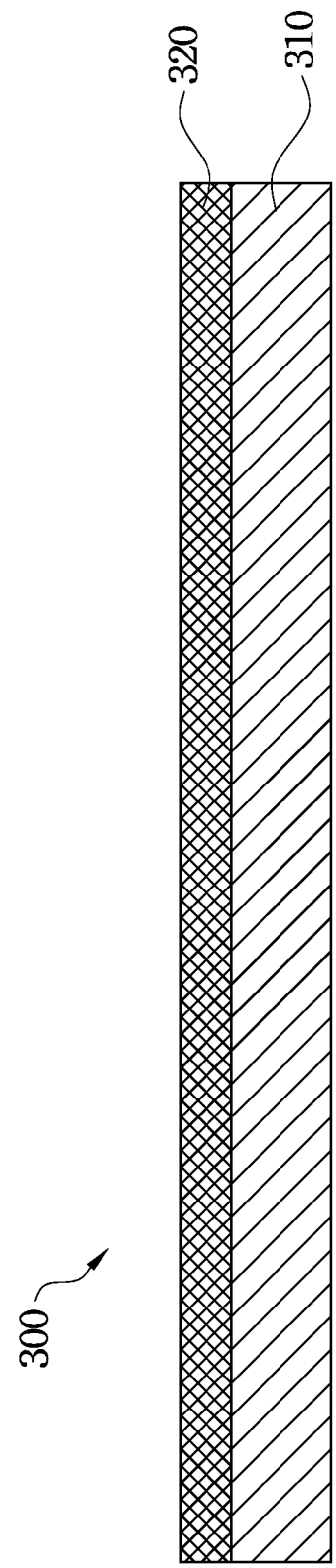
FIGS. 3-8 illustrate various intermediate stages of forming an embodiment.

FIGS. 3-8 illustrate various intermediate stages of forming a structure 300 according to an embodiment. Referring to FIG. 3, the structure 300 may include a substrate 310 having a passivation layer 320 formed thereon. In various embodiments, the substrate 310 may be substrate, a silicon substrate, an organic substrate, a ceramic substrate, a laminate substrate, an interposer, or the like. In various embodiments, the passivation layer 320 may be formed using, for example, sputtering, spin coating, a plasma process, such as plasma enhanced chemical vapor deposition ("PECVD"), thermal chemical vapor deposition ("CVD"), atmospheric pressure CVD ("APCVD"), physical vapor deposition ("PVD") and the like. In various embodiments, the passivation layer 320 may be formed to a thickness ranging from approximately 0.5 µm to approximately 2.5 µm.

Figure 4A:
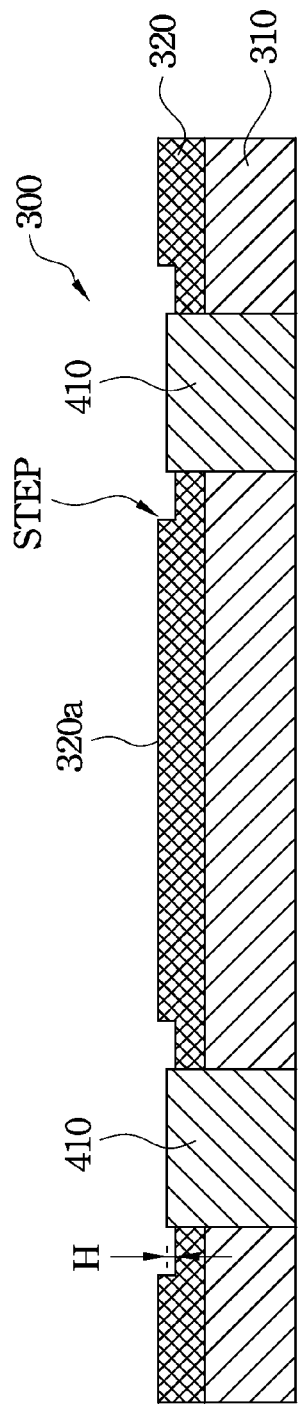

Referring to FIG. 4a, one or more TVs 410 may be formed through the passivation layer 320 and the substrate 310. Openings (not shown) in the passivation layer 320 and the substrate 310 may be formed using one or more etching processes, which may include dry etching, wet etching or combinations thereof, drilling processes or the like. In an embodiment, one or more photoresist layers (not shown) may be formed and patterned over the passivation layer 320 and the openings (not shown) may be formed according to the pattern using one or more etching processes. The openings formed through the passivation layer 320 and the substrate 310 may be filled with a conductive material using electrochemical deposition, electro plating or the like to form the TV(s) 410.

As shown in FIG. 4a, the TV(s) 410 may be formed to extend or protrude past a top surface 320a of the passivation layer 320 to a height H. The height H is exaggerated in FIG. 4a for illustrative purposes only. In various embodiments, the height H may range from approximately 0.05 µm to 0.5 µm. As discussed above, forming the first TV(s) 410 may involve forming and patterning one or more photoresist layers (not shown) over the passivation layer, forming openings (not shown) through the passivation layer 320 and the substrate 310, and depositing the TV(s) 410 in the openings.

Forming the TVs 410 to extend above the top surface 320a of the passivation layer 320 may provide several advantages. First, the portion of the TV 410 that extends past the top surface 320a of the passivation layer 320 may provide an increased conductive surface area on which to subsequently form a conductive layer (e.g., conductive layer 142 of FIG. 1) using an electroless plating process. The increased surface area may also promote formation of the conductive layer (not shown) over the TVs 410, which may aid in ensuring a CD/T ratio that may be greater than or equal to approximately 1 and less than approximately 20.

Second, by allowing the TVs 410 to extend above the top surface 320a of the passivation layer 320, manufacturing guidelines (e.g., deposition time, etc.) maybe relaxed for processes used to form the TVs 410. Forming a conductive layer (not shown) using one or more electroless plating processes may effectively fill-in gaps or steps that may be present between the TVs 410 and the top surface 320a of the passivation layer 320. Thus, processing time and/or cost may be reduced for formation of the TVs 410 according to embodiments of the present disclosure.

In another embodiment, also shown in FIG. 4a, the passivation layer 320 may be etched away around the TV 410 in a manner such that a step may be formed around the TV 410. The passivation layer 320 step may encircle the TV 410. The passivation layer 320 step may promote formation of a conductive layer (not shown in FIG. 4) over the TV 410 having a CD/T ratio that may be greater than or equal to approximately 1 and less than approximately 20

Figure 4B:
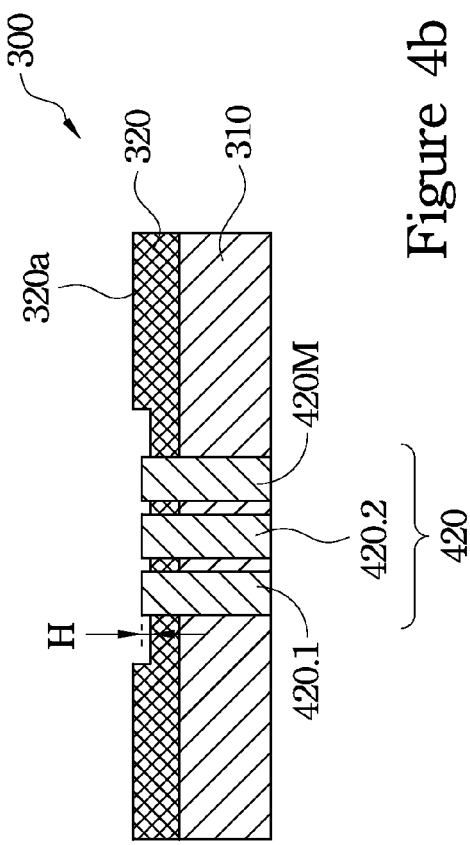

In an alternate embodiment, as illustrated in FIG. 4b, a plurality of TVs 420.1-420.N, which may collectively be referred to as TV 420, may be formed through the passivation layer 320 and the substrate 310. The plurality of TVs 420.1-420.N may provide a redundancy for the TV 420 that may pass through the passivation layer 320 and the substrate 310. In another embodiment, also shown in FIG. 4b, the passivation layer 320 may be etched away around the TV 420 in a manner such that a step may be formed around the TV 420. The passivation layer 320 step may encircle the TV 420. The passivation layer step may promote formation of a conductive layer (not shown in FIG. 4) over the TV 420 having a CD/T ratio that may be greater than or equal to approximately 1 and less than approximately 20.

Figure 5:
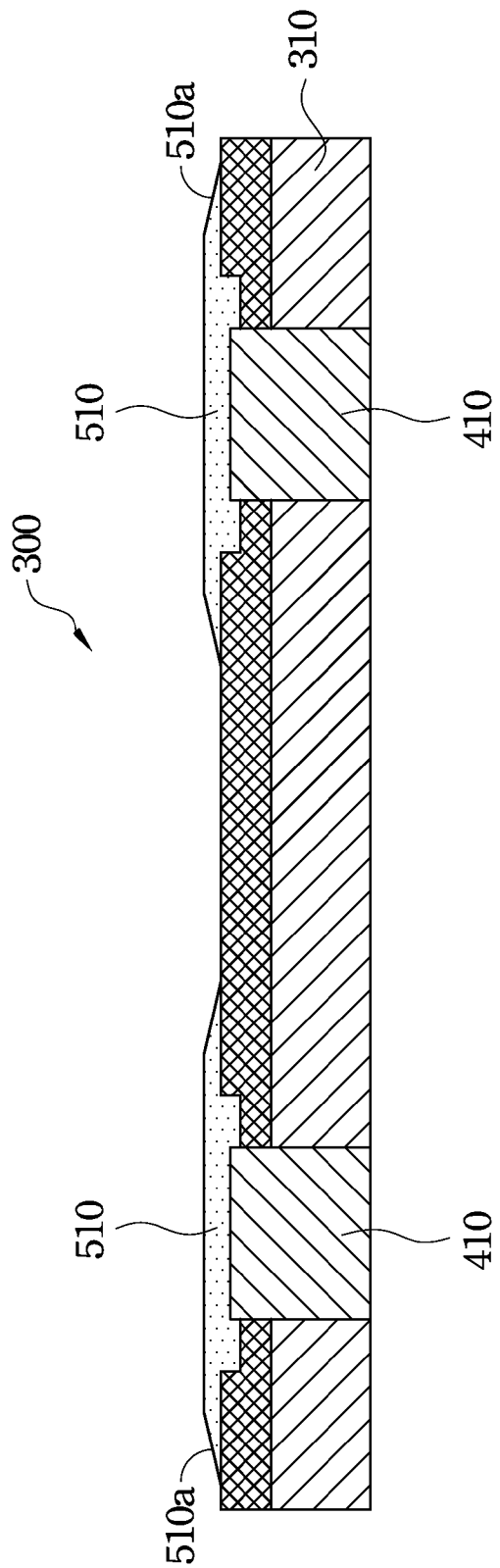

Referring to FIG. 5, a first conductive layer 510 may be formed over the TV(s) 410 using a first electroless plating process. The first conductive layer 510 may have a non-planar surface, which is described in more detail in FIG. 9, below. In various embodiments, the first conductive layer 510 may be formed of copper, aluminum, titanium, tin, palladium, platinum, combinations thereof or the like. The first conductive layer 510 may have sides 510a that may taper to the top surface 320a of the passivation layer 320. The taper of the first conductive layer 510 may gradually narrow until the first conductive layer 150 meets the top surface 320a of the passivation layer 320. The tapering may result from the first electroless plating process. The taper of the sides 510a may vary based on processing variations for the first electroless plating process such as material composition of the electroless plating solution and/or processing time.

Figure 6:
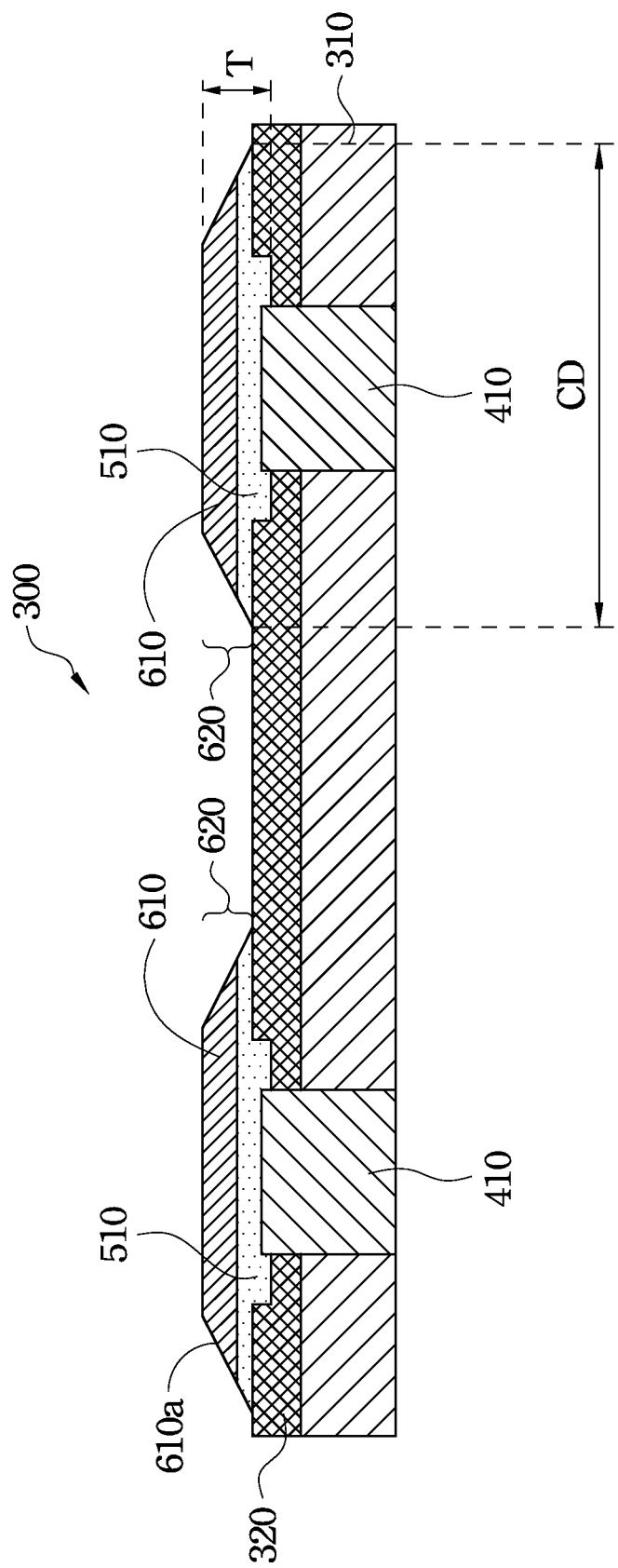

As shown in FIG. 6, a second conductive layer 610 may be formed on the first conductive layer 510 using a second electroless plating process. The second conductive layer 610 may have a non-planar surface, which is described in more detail in FIG. 9, below. The second conductive layer 610 may have sides 610a that may taper to the top surface 320a of the passivation layer 320 or to the first conductive layer 510. The tapering may result from the second electroless plating process. The taper of the conductive layer 610 may gradually narrow until the conductive layer 610 meets the top surface 320a of the passivation layer 320 or the first conductive layer 510. The taper of the sides 510a may vary based on processing variations for the second electroless plating process such as material composition of the electroless plating solution and/or processing time. The second conductive layer 610 may be formed of nickel, titanium, aluminum, tin, palladium, platinum combinations thereof or the like. The first conductive layer 510 and the second conductive layer 610 may be collectively referred to as conductive layer 620. The conductive layer 620 may be formed have a CD/T ratio that may be greater than or equal to approximately 1 and less than approximately 20, depending on processing variations for the electroless plating processes.

Figure 7A:
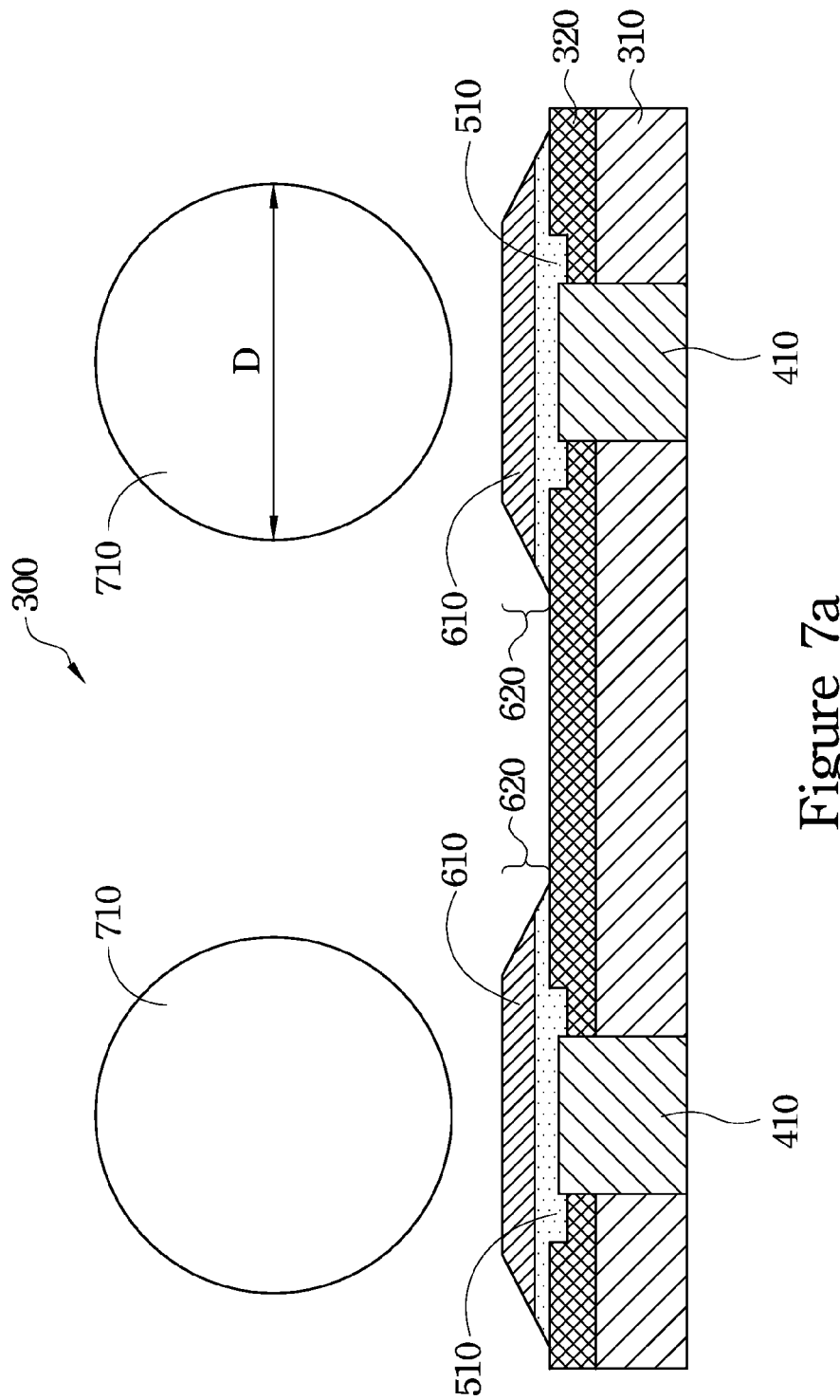

In an embodiment, as shown in FIG. 7a, conductive balls 710 may be mounted on the conductive layer 620. In an embodiment, a flux material (not shown) may be dispensed over the conductive layer 620, which may keep the conductive balls 710 in place on the conductive layers before a reflow may be performed. The conductive balls 710 may have a diameter D ranging from approximately 20 µm to approximately 200 µm. A ratio of the diameter D of the conductive balls 710 to the CD of the conductive layer(s) 620 may range from 1 to 2.

In another embodiment, as shown in FIG. 7b, a conductive paste 720 may be formed on the conductive layer 620. The conductive paste 720 may be printed or deposited on the conductive layer 620 using a print mask (not shown) to align the conductive paste 720 to the conductive layer 620. The conductive paste may be formed to a height $H_P$, which may range from approximately 20 µm to approximately 200 µm.

Figure 8:
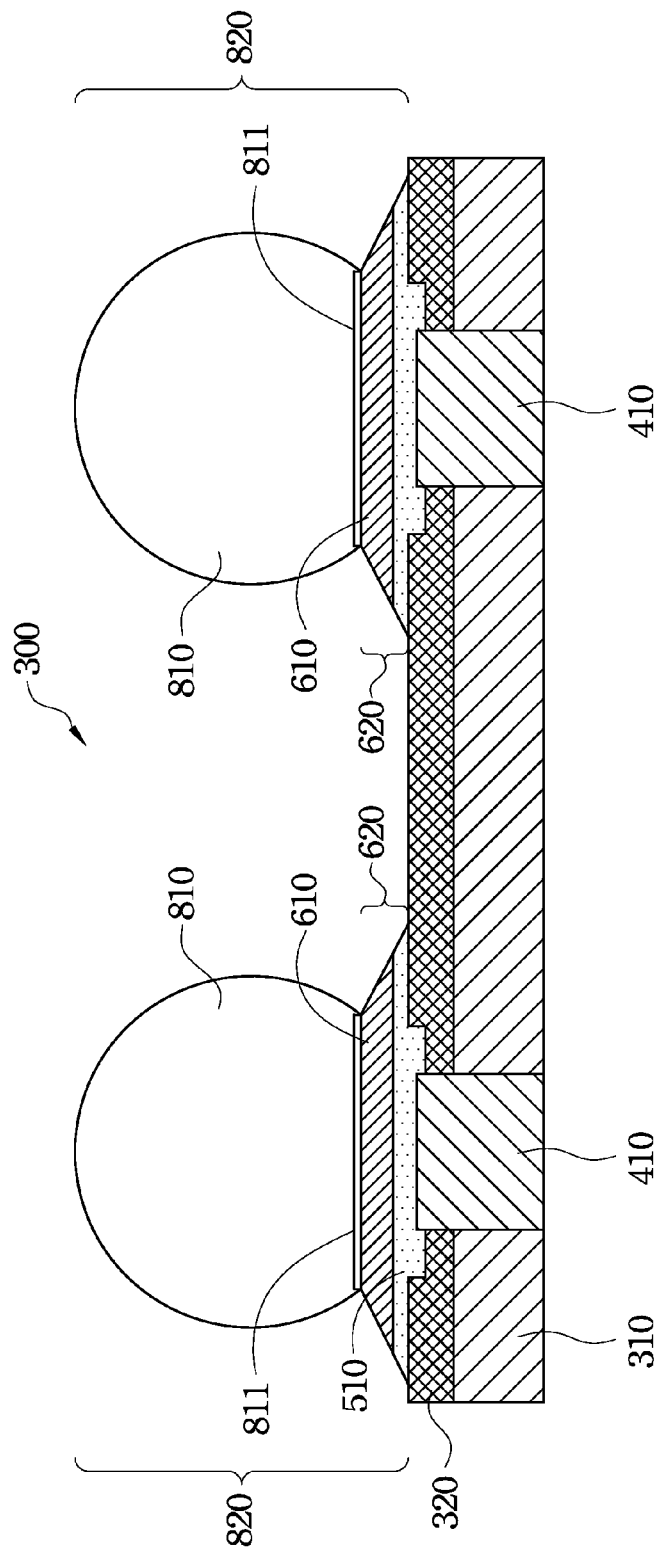

As shown in FIG. 8, a reflow process may be performed to reflow the conductive balls 710 of FIG. 7a or the conductive paste 720 of FIG. 7b to form conductive bumps 810 for the structure 300. The conductive bumps 810 and the conductive layers 620 may together form a conductive structure 820. In an embodiment, the reflowing may form an inter-metallic compound ("IMC") layer 811 between the conductive bumps 810 and the conductive layers 620, which may also have a non-planar surface.

FIG. 9 illustrates a cross-sectional XSEM image 900 of a conductive layer 940 formed according to an embodiment. The cross-sectional XSEM image illustrates a substrate 910, a passivation layer 920, a TV 930 and the conductive layer 940 formed over the TV 930. A portion of the passivation layer 920 has been removed to form a ring or step around the TV 930. The conductive layer 940 has been formed directly over the TV 930 using an electroless copper plating process.

As illustrated in FIG. 9, the conductive layer 940 may taper from a top surface 940a of the conductive layer 940 to the passivation layer 920. The taper of the conductive layer 940 may gradually narrow until the conductive layer 940 meets the passivation layer 920. The conductive layer 940 shown in FIG. 9 has a CD of approximately 97 µm and a thickness T of approximately 9.8 µm. Accordingly, the CD/T ratio of the conductive layer 940 is approximately 9.9 µm, which falls within the range of a CD/T ratio of greater than or equal to approximately 1 and less than approximately 20. As further illustrated in FIG. 9, the top surface 940a of the conductive layer 940 may be non-planar across the CD of the conductive layer 940. The non-planar top surface 940a is a product of the electroless copper plating process used to form the conductive layer 940.

In an embodiment, an apparatus is provided. The apparatus may comprise a substrate; a passivation layer formed over the substrate; a first through via (TV) formed through the substrate and the passivation layer, wherein a first surface of the first TV extends above a first surface of the passivation layer; a conductive layer formed directly over the first TV and the passivation layer, the conductive layer having a non-planar surface and sides that taper from a first surface of the conductive layer to the first surface of the passivation layer; a conductive bump formed directly over the conductive layer.

In an embodiment, a method is provided. The method may comprise forming a first through via (TV) through a substrate and a passivation layer, wherein the first TV having a first surface extending above the first surface of the passivation layer; forming a conductive layer over the first TV, the conductive layer having a non-planar surface and having sides that taper from a first surface of the conductive layer to the first surface of the passivation layer, wherein the conductive layer is formed at least in part using an electroless plating process; and forming a conductive bump on the conductive layer.

In another embodiment, another method is provided. The method may comprise forming a plurality of through vias (TVs) through a passivation layer and a substrate, wherein the plurality of TVs extend above a first surface of the passivation layer; forming one or more conductive layers directly over a first group of the plurality of TVs using one or more electroless plating processes, the one or more conductive layers having a non-planar surface, wherein sides of the one or more conductive layers taper from an uppermost conductive layer of the one or more conductive layers down to the first surface of the passivation layer; and forming a conductive bump on the uppermost conductive layer of the one or more conductive layers.

Although the present embodiments and their advantages have been described in detail, it should be understood that various changes, substitutions and alterations can be made herein without departing from the spirit and scope of the disclosure as defined by the appended claims. For example, it will be readily understood by those skilled in the art that the structures and ordering of steps as described above may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
    a substrate;
    a passivation layer formed over the substrate;
    a first through via (TV) formed through the substrate and the passivation layer, wherein a first surface of the first TV extends above a first surface of the passivation layer;
    a conductive layer formed directly over the first TV and the passivation layer, the conductive layer having a non-planar surface and sides that taper from a first surface of the conductive layer to the first surface of the passivation layer; and
    a conductive bump formed directly over the conductive layer.

2. The apparatus of claim 1, wherein the first surface of the first TV extends from between approximately 0.05 μm to approximately 0.5 μm above the first surface of the passivation layer.

3. The apparatus of claim 1, wherein the conductive layer comprises:
    a first layer formed over the first TV, the first layer having first tapered sides; and
    a second layer formed over the first layer, the second layer having second tapered sides.

4. The apparatus of claim 3, wherein the first layer is formed of copper, aluminum, palladium and wherein the second layer is formed of nickel.

5. The apparatus of claim 1, wherein the conductive layer has a critical dimension and a thickness and wherein a ratio of the critical dimension to the thickness ranges from one to approximately twenty.

6. The apparatus of claim 1, wherein the conductive layer is made of copper, nickel, aluminum, tin, platinum, palladium, titanium or combinations thereof.

7. The apparatus of claim 1, wherein the passivation layer has a thickness between 0.5 μm and 2.5 μm.

8. The apparatus of claim 1, wherein the passivation layer includes a step surrounding the first TV.

9. The apparatus of claim 1, wherein the first TV comprises plurality of first TVs and wherein the conductive layer is formed directly over the plurality of first TVs and the passivation layer.

10. A method of forming a conductive structure, comprising:
    forming a first through via (TV) through a substrate and a passivation layer, wherein the first TV having a first surface extending above the first surface of the passivation layer;
    forming a conductive layer over the first TV, the conductive layer having a non-planar surface and having sides that taper from a first surface of the conductive layer to the first surface of the passivation layer, wherein the conductive layer is formed at least in part using an electroless plating process; and
    forming a conductive bump on the conductive layer.

11. The method of claim 10, wherein the first TV comprises a plurality of first TVs and wherein the conductive layer is formed over the plurality of first TVs.

12. The method of claim 10, wherein the forming the conductive layer comprises:
    forming a plurality of conductive layers over the first TV, wherein a first layer is formed using a first electroless plating process.

13. The method of claim 12, wherein the forming the plurality of conductive layers further comprises:
    forming a second layer over the first layer using a second electroless plating process.

14. The method of claim 10, wherein the conductive layer has a critical dimension and a thickness and wherein a ratio of the critical dimension to the thickness ranges from approximately one to approximately twenty.

15. The method of claim 10, wherein the conductive layer is made of copper, nickel, aluminum, tin, platinum, palladium, titanium or combinations thereof.

16. A method comprising:
    forming a plurality of through vias (TVs) through a passivation layer and a substrate, wherein the plurality of TVs extend above a first surface of the passivation layer;
    forming one or more conductive layers directly over a first group of the plurality of TVs using one or more electroless plating processes, the one or more conductive layers having a non-planar surface, wherein sides of the one or more conductive layers taper from an uppermost conductive layer of the one or more conductive layers down to the first surface of the passivation layer; and
    forming a conductive bump on the uppermost conductive layer of the one or more conductive layers.

17. The method of claim 16, wherein the plurality of TVs extend from between approximately 0.05 μm to approximately 0.5 μm above the first surface of the passivation layer.

18. The method of claim 16, further comprising:
    forming a step in the passivation layer surrounding the first group of the plurality of TVs.

19. The method of claim 16, wherein the forming the one or more conductive layers directly over the first group of the plurality of TVs further comprises:
- forming a first conductive layer directly over the first group of the plurality of TVs using a first electroless plating process; and
- forming a second conductive layer directly over the first layer using a second electroless plating process.

20. The method of claim 16, wherein the conductive layer is made of copper, nickel, aluminum, tin, platinum, palladium, titanium or combinations thereof.

* * * * *